(12) United States Patent
Dabral et al.

(10) Patent No.: US 12,494,468 B2
(45) Date of Patent: Dec. 9, 2025

(54) 3D SYSTEM AND WAFER RECONSTITUTION WITH MID-LAYER INTERPOSER

(71) Applicant: Apple Inc., Cupertino, CA (US)

(72) Inventors: Sanjay Dabral, Cupertino, CA (US); SivaChandra Jangam, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 566 days.

(21) Appl. No.: 17/934,409

(22) Filed: Sep. 22, 2022

(65) Prior Publication Data

US 2024/0105699 A1 Mar. 28, 2024

(51) Int. Cl.
| H01L 25/18 | (2023.01) |
| H01L 23/00 | (2006.01) |
| H01L 23/31 | (2006.01) |
| H01L 23/48 | (2006.01) |
| H01L 23/498 | (2006.01) |

(52) U.S. Cl.
CPC .......... *H01L 25/18* (2013.01); *H01L 23/3128* (2013.01); *H01L 23/481* (2013.01); *H01L 23/49827* (2013.01); *H01L 24/08* (2013.01); *H01L 24/05* (2013.01); *H01L 24/80* (2013.01); *H01L 2224/05644* (2013.01); *H01L 2224/05647* (2013.01); *H01L 2224/08225* (2013.01); *H01L 2224/80379* (2013.01); *H01L 2224/80444* (2013.01); *H01L 2224/80447* (2013.01)

(58) Field of Classification Search
CPC .... H01L 25/18; H01L 23/3128; H01L 23/481
See application file for complete search history.

(56) References Cited

U.S. PATENT DOCUMENTS

| 6,845,184 | B1 | 1/2005 | Yoshimura et al. |
| 11,158,607 | B2 | 10/2021 | Dabral et al. |
| 11,309,246 | B2 | 4/2022 | Dabral et al. |
| 2005/0110131 | A1 | 5/2005 | Lee |
| 2006/0258120 | A1 | 11/2006 | Gilroy et al. |
| 2016/0071818 | A1 | 3/2016 | Wang et al. |

(Continued)

FOREIGN PATENT DOCUMENTS

| JP | 2000114581 A | 4/2000 |
| KR | 20170051474 A | 5/2017 |

OTHER PUBLICATIONS

ComBond® high vacuum wafer bonding technology. ComBond® Technology. (n.d.). Retrieved Nov. 10, 2022, from https://www.evgroup.com/technologies/combond-technology/, 7pages.

(Continued)

*Primary Examiner* — Thao P Le
(74) *Attorney, Agent, or Firm* — Aikin & Gallant, LLP

(57) ABSTRACT

A system in package structure and method of fabrication using wafer reconstitution are described. In an embodiment a 3D system includes a mid-layer interposer a first package level underneath the mid-layer interposer and a second package level over the mid-layer interposer. Second package level components can be bonded to the mid-layer interposer with metal-metal bonds and optionally dielectric-dielectric bonds, while the first package level components can be bonded to the mid-layer interposer with dielectric-dielectric and optionally metal-metal bonds.

21 Claims, 11 Drawing Sheets

(56) References Cited

U.S. PATENT DOCUMENTS

| | | | |
|---|---|---|---|
| 2017/0092626 | A1 | 3/2017 | Yuan et al. |
| 2019/0214365 | A1 | 7/2019 | Gu et al. |
| 2019/0333871 | A1* | 10/2019 | Chen .................... H01L 23/5384 |
| 2019/0355706 | A1 | 11/2019 | Enquist et al. |
| 2020/0176419 | A1 | 6/2020 | Dabral et al. |
| 2021/0125967 | A1 | 4/2021 | Zhai |
| 2021/0242170 | A1 | 8/2021 | Dabral et al. |
| 2022/0013504 | A1 | 1/2022 | Dabral et al. |
| 2022/0102280 | A1 | 3/2022 | Dabral et al. |
| 2022/0285273 | A1 | 9/2022 | Dabral et al. |
| 2022/0328467 | A1* | 10/2022 | Chen .................... H01L 23/5385 |
| 2023/0378055 | A1* | 11/2023 | Wu ........................ H01L 21/568 |
| 2023/0420437 | A1* | 12/2023 | Chen ................. H01L 21/76898 |
| 2024/0063179 | A1* | 2/2024 | Elsherbini ............... H01L 25/50 |
| 2024/0063208 | A1* | 2/2024 | Lee ........................ H01L 23/562 |
| 2024/0071847 | A1* | 2/2024 | Liao ....................... H01L 23/053 |
| 2024/0071933 | A1* | 2/2024 | Marin ................... H01L 23/481 |
| 2024/0105545 | A1* | 3/2024 | Lu ....................... H01L 25/0652 |
| 2024/0113007 | A1* | 4/2024 | Duong ................ H01L 21/4853 |
| 2024/0113088 | A1* | 4/2024 | Karhade ................. H01L 24/19 |
| 2024/0297087 | A1* | 9/2024 | Chang .................. H01L 21/568 |
| 2025/0079392 | A1* | 3/2025 | Karhade ............ H01L 25/0652 |

OTHER PUBLICATIONS

EVG,"EVG® ComBond®", Received from https://www.evgroup.com/fileadmin/media/products/bonding/Permanent_Bonding/combond/EVG_ComBond_Brochure.pdf, 6 pages.

EVG, "Solutions for MEMS", Received from https://www.evgroup.com/fileadmin/media/technologies/EVG_Solutions_for_MEMS_Brochure_22_01.pdf, 6 pages.

EVG, "Transient Liquid Phase (TLP) Bonding" Low-temperature metal wafer bonding by Transient Liquid Phase (TLP), Received from https://www.evgroup.com/technologies/transient-liquid-phase-tlp-bonding/, 6 pages.

EVG, "Die-to-Wafer Fusion and Hybrid Bonding" Received from https://www.evgroup.com/technologies/die-to-wafer-fusion-and-hybrid-bonding/, 8 pages.

Don Scansen, "AMD, TSMC & Imec Show Their Chiplet Playbooks at ISSCC", Received from https://www.eetimes.com/amd-tsmc-imec-show-their-chiplet-playbooks-at-isscc/, Feb. 26, 2021, 8 pages.

Convection Wizard, "Natural Convection on Isothermal Vertical Plate", received from https://thermal.mayahtt.com/tmwiz/convect/natural/vp-isot/vp-isot.htm, Publish date unknown, 2 pages.

Goldstein, E., Raman, A. & Fan, S. Sub-ambient non-evaporative fluid cooling with the sky. Nat Energy 2, 17143 (2017). https://doi.org/10.1038/nenergy.2017.143.

Raman, A., Anoma, M., Zhu, L. et al. Passive radiative cooling below ambient air temperature under direct sunlight. Nature 515, 540-544 (2014). https://doi.org/10.1038/nature13883.

Savage, N. (Jun. 24, 2021). Solar cells that make use of Wasted Light. Nature News. Retrieved Nov. 10, 2022, from https://www.nature.com/articles/d41586-021-01673-w.

Huang et al., "Enhancing solar cell efficiency: the search for luminescent materials as spectral converters", Received from https://pubs.rsc.org/en/content/articlehtml/2013/cs/c2cs35288e, Jul. 27, 2012, 78 pages.

W. S. Liao et al., "A manufacturable interposer MIM decoupling capacitor with robust thin high-K dielectric for heterogeneous 3D IC CoWoS wafer level system integration," 2014 IEEE International Electron Devices Meeting, 2014, pp. 27.3.1-27.3.4, doi: 10.1109/IEDM.2014.7047119.

Hu et al., "Process Development to Enable 3D IC Multi-Tier Die Bond for 20μM Pitch and Beyond", received from https://ieeexplore.ieee.org/document/6897342, May 27-30, 2014, 4 pages.

Veliadis et al., "6.9-cm Active-area interconnected wafer 4 kV PiN diode pulsed at 55 kA", received from https://ieeexplore.ieee.org/document/7369281, Nov. 2-4, 2015, 4 pages.

Veliadis et al., "6.9-cm2 Active-Area Interconnected Wafer 4-kV p-i-n Diode Pulsed at 55 kA", received from https://ieeexplore.ieee.org/document/7429702, Mar. 9, 2016, 5 pages.

Liao et al., "A manufacturable interposer MIM decoupling capacitor with robust thin high-K dielectric for heterogeneous 3D IC CoWoS wafer level system integration", received from https://ieeexplore.ieee.org/document/7047119, Dec. 15-17, 2014, 4 pages.

M.W. Yung, "Repairing power shorts in WSI circuits using infra-red imaging and laser cutting", received from https://ieeexplore.ieee.org/document/171807, Jan. 22-24, 1992, 3 pages.

PCT/US2023/031878, "PCT Notification of Transmittal of the International Search Report and the Written Opinion of the International Searchinf Authoriity, or the Declaration", mailed Dec. 26, 2023, 11 pages.

* cited by examiner

3D SYSTEM AND WAFER RECONSTITUTION WITH MID-LAYER INTERPOSER

BACKGROUND

Field

Embodiments described herein relate to semiconductor packaging. More particularly, embodiments relate to three-dimensional (3D) systems and methods of fabrication.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher die/component density devices.

There are many different possibilities for arranging multiple dies in an SiP. For example, vertical integration of die in SiP structures has evolved into 2.5D solutions and 3D solutions. In 2.5D solutions the multiple dies may be flip chip bonded on an interposer that may include through vias as well as fan out wiring. Various 3D solutions exist. In one implementation multiple dies may be stacked on top of one another on an SiP substrate, and connected with off-chip wire bonds or solder bumps. In other traditional 3D solutions hybrid bonding using wafer on wafer (WoW) or chip on wafer (CoW) techniques is utilized. In a WoW solution, the top and bottom device area dimensions are exactly matched, and each layer is restricted to one technology node. In such a CoW solution multiple top wafers (chips) can be integrated onto the same bottom wafer with defined area and technology node.

SUMMARY

Three-dimensional (3D) systems and methods of fabrication are described. In an embodiment, a 3D system includes a mid-layer interposer, a first package level underneath the mid-layer interposer, the first package level including a component bonded to the mid-layer interposer with dielectric-dielectric bonds, and a second package level over the mid-layer interposer, the second package level including a first die bonded to the mid-layer interposer with metal-metal bonds. Each of the component and first die can optionally be hybrid bonded with the mid-layer interposer. In particular, the 3D systems can be fabricated utilizing a wafer reconstitution sequence with wafer-on-wafer (WoW) or chip-on-wafer (CoW) hybrid bonding techniques. Vertical interconnections can be achieved with through vias formed through any combination of the component(s), mid-layer interposer and encapsulation material.

DETAILED DESCRIPTION

Embodiments describe three-dimensional (3D) systems and multi-chip modules (MCMs) and methods of fabrication in which wafer reconstitution with a mid-layer interposer is used to form 3D systems with ample connectivity between dies and a module substrate, performance (e.g. process node optimization) and power distribution for a scaled 3D system. In particular, the mid-layer interposer in accordance with embodiments can facilitate wafer reconstitution sequences that utilize wafer-on-wafer (WoW) or chip-on-wafer (CoW) hybrid bonding techniques. In this manner, the various dies and components can be connected with high pin density and low latency. The mid-layer interposer may additionally provide additional routing area, allowing for die partitioning and process node optimization, as well as flexibility for power delivery and integration of passive devices into the 3D system. In an embodiment the 3D system is a three-dimensional integrated circuit (3DIC), system-in-package (SiP), or other system.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "underneath", "over", "to", "between", and "on" as used herein may refer to a relative position of one layer with respect to other layers. One layer "underneath", "over", or "on" another layer or bonded "to" or in "contact" with another layer may be directly in contact with the other layer or may have one or more intervening layers. One layer "between" layers may be directly in contact with the layers or may have one or more intervening layers.

Figure 1:
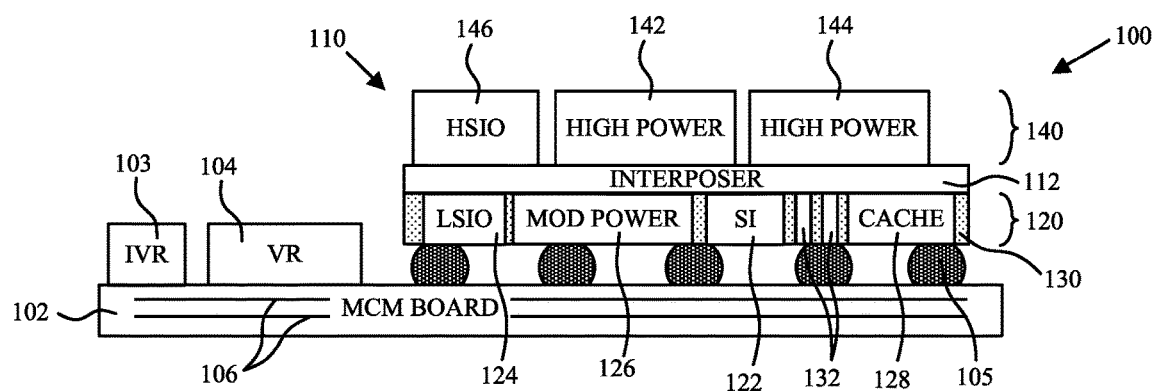
FIG. 1 is a schematic cross-sectional side view illustration of a multi-chip module (MCM) including a 3D system with mid-layer interposer mounted onto a module substrate in accordance with an embodiment.

Referring now to FIG. 1 a cross-sectional side view illustration is provided of a multi-chip module (MCM) 100 including a 3D system 110 with mid-layer interposer 112 mounted onto a circuit board 102 in accordance with an embodiment. In an embodiment, a 3D system 110 includes a mid-layer interposer 112, a first package level 120 underneath the mid-layer interposer and a second package level 140 over the mid-layer interposer 112. The first package level 120 may include one or more components bonded to the interposer 112 with dielectric-dielectric bonds (and optionally metal-metal bonds), and the second package level 140 may include at least one logic die hybrid bonded to the mid-layer interposer 112 with metal-metal bonds (and optionally dielectric-dielectric bonds). The dielectric-dielectric bonds can be oxide-oxide, oxynitride-oxynitride, or other dielectric materials. For example, metal-metal bonds can include bonds achieved using thermal compression bonding, including copper-copper bonds, gold-gold bonds, etc. and may additionally be inclusive of hybrid bonding where dielectric-dielectric bonds also exist. Vertical interconnection in accordance with embodiments can be achieved using through vias (TVs) 132 that extend through the component(s) (e.g. through silicon vias, through silicon-germanium vias, etc.), through the encapsulation layer 130 material (e.g. through oxide vias or through mold vias), and through the mid-layer interposer 112. Through vias can be formed in a variety of manners and at a variety of different process stages.

A variety of components can be included in the first package level 120. For example, the component can be a moderate power die 124 (or low power) such as a system-on-chip (SOC), logic, memory, power management integrated circuit (PMIC), etc. Additional components include, but are not limited to, a low speed input/output (LSIO) die 126, cache die 128, and silicon interconnect 122. The silicon interconnect 122, for example, can be a chiplet including lateral routing for die-to-die connections. In some embodiments, no logic or passive devices are included in the silicon interconnect 122, and the silicon interconnect is used primarily for fine die-to-die wiring. In other embodiments capacitors or logic can be included within the silicon interconnect 122 in combination with the fine die-to-die wiring. In the illustrated embodiments components included in the second package level 140 can include high speed input/output (HSIO) die 146, and one or more high power dies 142, 144 such as a graphics processing unit (GPU), central processing unit (CPU), artificial intelligence (AI), machine learning logic, radio-frequency (RF) baseband processor, radio-frequency (RF) antenna, signal processors, power management integrated circuit (PMIC), logic, memory, photonics, biochips, silicon interconnect and any combinations thereof. It is to be appreciated that the specific listing and illustration of components in the first and second package levels is exemplary, and embodiments are not limited to these specific examples.

As shown, the 3D system 110 can be mounted onto a circuit board 102 of the multi-chip module 100. Additional components such as one or more voltage regulators 104, high efficiency inductor voltage regulator 103, passives, and other subsystems can be mounted onto the circuit board 102. The voltage regulator 104 may be connected with the 3D system 110 through one or power rails 106 within the circuit board 102 to provide high and low power. The moderate power die 124 for example, may include a control circuit including various switches to close or open high voltage and low voltage channels from the voltage regulator 104. The high efficiency inductor voltage regulator 103 may additionally be connected with the power rails, for example to provide droop assist when the dies are operating in modes with large current change transients.

The mid-layer interposer 112 in accordance with embodiments may be passive, and may include an array of passive devices such as capacitors connected to the high voltage and low voltage channels in order to control the voltage output to circuit loads of the various components, including the high power dies 142, 144 or other dies. In this manner, much of the power management for the dies can be integrated into the 3D system 110, and directly underneath the high power dies 142, 144.

In one aspect, it has been observed that traditional 3D wafer reconstitution techniques have limitations for hybrid bonded die stacking where hybrid bonded dies cannot bridge across different die boundaries such as overlap of bonded dies with two or more die boundaries. These may cause topography differences, leading to voids, non-bonding or other issues. The mid-layer interposer 112 in accordance with embodiments facilitates such die bridging, with high pin (contact pad) densities and low latency. As such, the silicon interconnect 122 can bridge across the high power dies 142, 144. The mid-layer interposer 112 in accordance with embodiments can provide a bonding interface and electrical interconnections only, or include passives such as trench capacitors, or metal-insulator-metal (MIM) capacitors, magnetic elements (inductors, coupled inductors, etc.), or even include active devices. In some embodiments, mid-layer interposer 112 approximately spans the surface area of one or both of first package level 120 and second package level 140. In some embodiments, mid-layer interposer 112 spans a subset of the surface area of first package level 120 and/or spans a subset of the surface area of second package level 140. In some embodiments, at least one lateral dimension of mid-layer interposer 112 extends beyond a corresponding lateral dimension of first package level 120 and/or second package level 140.

Figure 2:
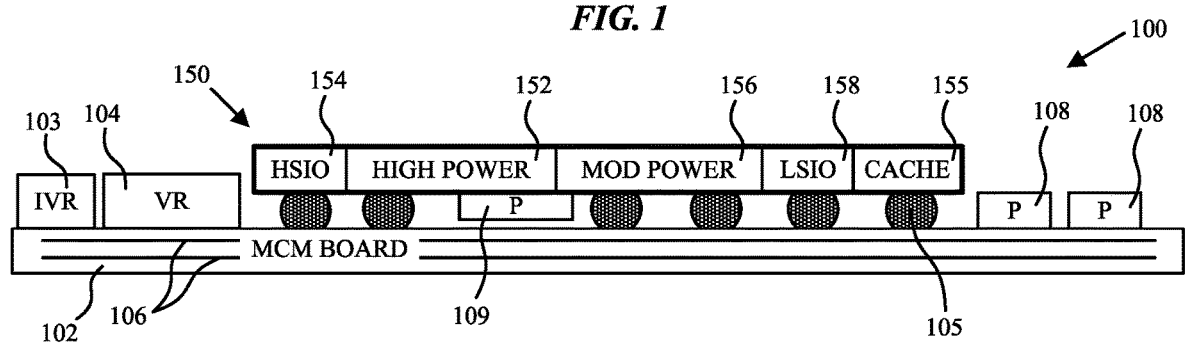
FIG. 2 is a schematic cross-sectional side view illustration of an MCM including a monolithic die mounted onto a module substrate.

In another aspect, embodiments facilitate die partitioning such that process nodes can be optimized for different intellectual property (IP) blocks. In order to illustrate this effect a cross-sectional side view illustration of an MCM including a monolithic die 150 mounted onto a circuit board 102 is shown in FIG. 2. As shown in the exemplary illustration, the various IP blocks 152, 154, 155, 156, 158 (corresponding to high power, HSIO, cache, moderate power, LSIO in the example) are formed in a monolithic die, which is formed with the same process node (e.g. transistor size). In this manner, the selected process node may be ideal for some IP blocks but not all. Furthermore, larger dies can be associated with a greater number of likely process failures leading to more expenses associated with die rejects.

In yet another aspect, embodiments facilitate other crucial functions including but not limited to circuit board power distribution to the 3D system. Still referring to FIG. 2, it is shown that such a monolithic die configuration also requires additional circuit board 102 area for passive devices 108, 109. This may also require additional board routing and power rails 106. While necessary circuit board 102 area can be reduced somewhat by locating passive devices 109 underneath the monolithic die 150, this can also have the effect of reducing area for power delivery to the monolithic die 150, and increasing wiring requirements of the monolithic die. It is to be appreciated that while a passive device 109 is shown as being mounted onto an underside of the monolithic die 150 in FIG. 2, that this is also possible with the 3D system 110 of FIG. 1.

Figure 3:
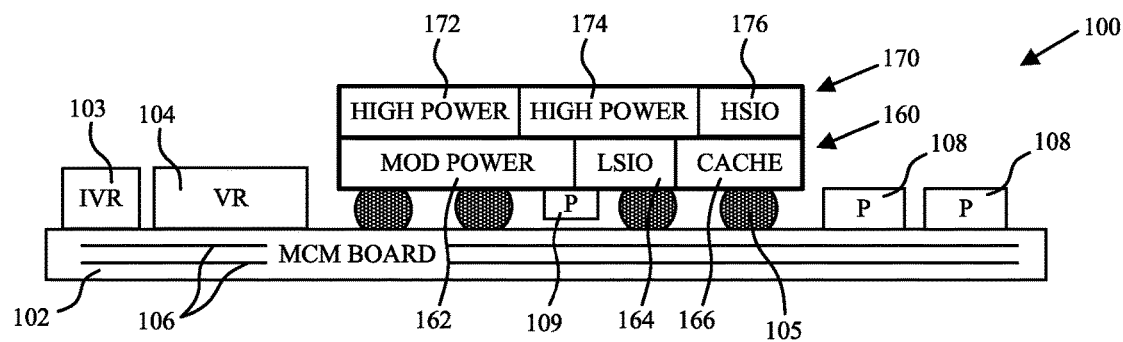
FIG. 3 is a schematic cross-sectional side view illustration of an MCM including 3D stacked dies mounted onto a module substrate.

Referring now to FIG. 3, a schematic cross-sectional side view illustration of an MCM including 3D stacked dies 160, 170 mounted onto a circuit board 102. The 3D stacked dies may have similar IP blocks 162, 164, 166, 172, 174, 176 (corresponding to moderate power, LSIO, cache, high power, high power, HSIO, respectively, in this example). As shown, the 3D die stacking can reduce overall circuit board area, though power delivery to the 3D die stack can be oversubscribed, with the number of power rails/area impacting voltage droop (IR), electromigration (EM) and AC impedance. Furthermore, the 3D die stacking of FIG. 2, like the monolithic die 150 of FIG. 1, does not facilitate process node optimization for all IP blocks.

Now referring again to FIG. 1, the 3D system 110 in accordance with embodiments and mid-layer interposer 112 can accommodate many attributes, including process node optimization, area reduction, power distribution, and low inductance interconnects. Fundamentally, the mid-layer interposer 112 can provide a prime bonding surface with controlled roughness, particles, and dishing/protrusion tolerances that allows for dielectric-dielectric and/or metal-metal bonding, with mitigated voiding and delamination, and tight alignment distribution in the nanometer range. The mid-layer interposer may optionally have additional integrated functionality. In an exemplary embodiment, voltage regulation can be largely integrated within the 3DIC, particularly when capacitors are integrated into the mid-layer interposer 112. Furthermore, wafer sizes used to form the components in the different package levels can be arbitrary, and not yield limiting for the stacked 3D system. The components can be different technologies (IP blocks) and formed with different process nodes (e.g. transistor size, etc.). Vias may be additionally provided through the bottom components to provide power supply, or support with decoupling capacitors, for example.

Figure 4A:
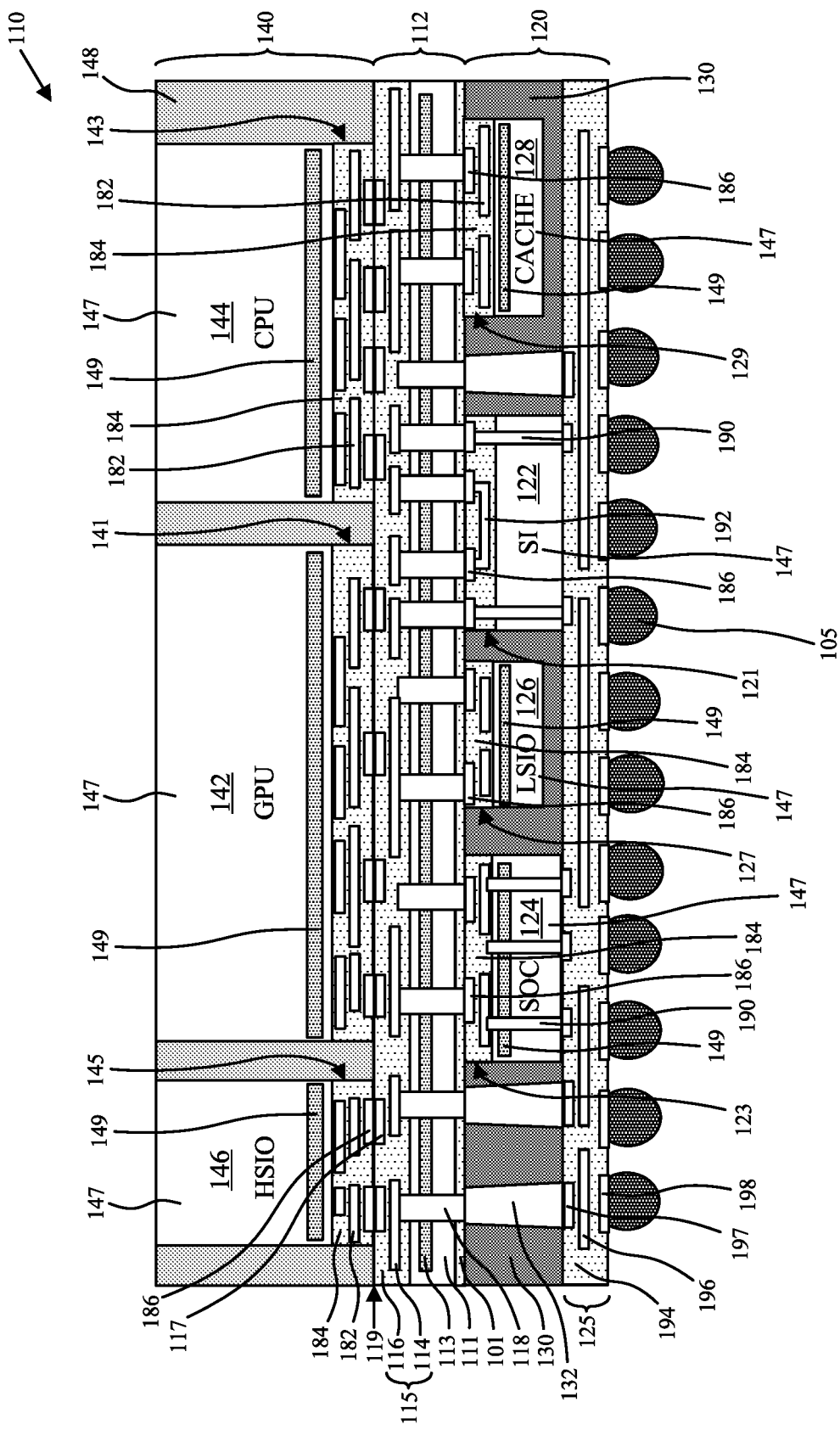
FIGS. 4A-4B are schematic cross-sectional side view illustrations of 3D systems with mid-layer interposers in accordance with embodiments.

FIG. 4A is a schematic cross-sectional side view illustration of a 3D system 110 with mid-layer interposer 112 in accordance with an embodiment. In particular, FIG. 4A provides additional detail for a 3D system 110 such as the one illustrated in FIG. 1. As shown, the 3D system 110 can include a mid-layer interposer 112, a first package level 120 underneath the mid-layer interposer, and a second package level 140 over the mid-layer interposer. The first package level 120 can include one or more components bonded to the interposer with dielectric-dielectric bonds and/or metal-metal bonds. The dielectric-dielectric bonds can be oxide-oxide, oxynitride-oxynitride, or other dielectric materials. Thus, the components can be bonded face-side up to the mid-layer interposer 112 (such as with landing pads 186 and oxide dielectric layer 184 of a back-end-of-the-line (BEOL) build-up structure of the component) as shown, or be bonded back-side up to the mid-layer interposer 112 (such as with a back side oxide bonding layer on a back side of a silicon bulk layer 147 of the component). In the illustrated embodiment hybrid bonding with metal-metal bonds and dielectric-dielectric bonds may be accomplished. The various components in the first package level may have the same or different thicknesses. For example, the thinner components (e.g. the illustrated silicon interconnect 122, moderate power die 124) may not have through vias for vertical interconnection.

The second package level 140 can similarly include one or more components bonded to the mid-layer interposer with dielectric-dielectric bonds and/or metal-metal bonds. As shown in FIG. 4A, each of the exemplary HSIO die 146, high power die 142 (e.g. logic die such as GPU or CPU), high performance die 144 (logic die such as GPU or CPU), moderate performance die 124 (such as SOC, logic, memory), LSIO die 126, cache die 128, and silicon interconnect 122 can include BEOL build-up structures 145, 141, 143, 123, 127, 129 and 121, respectively.

Furthermore, the BEOL build-up structures may be formed over a silicon bulk layer 147, which may contain a plurality of devices 149 formed in specific process nodes. For example, devices 149 can include transistors for active devices, as well as storage devices such as SRAM/DRAM/MRAM (or other technologies) for cache die 128. Devices 149 may be also formed within the silicon interconnect 122, including both passive (including trench capacitors) and active devices.

In accordance with embodiments the various components in the first and second package levels can be monolithic or stacked chips. For example, memory or other types of components may have stacked chips.

Each BEOL build-up structure may include one or more dielectric layers 184 (inclusive of a top oxide bonding layer), metal wiring layers 182 such as copper and landing pads 186. Landing pads 186 can by metal-metal bonded with landing pads 117 and through vias 118 of the mid-layer interposer 112. The metal wiring layers 182 of the silicon interconnect 122 may form die-to-die wiring 192 for interconnection between multiple dies. The complete die-to-die routing path may pass through a portion of the set of through vias 118 extending through the mid-layer interposer, and be connected with die-to-die wiring 192. Wiring within the BEOL build up structures may be fabricated using suitable damascene processing for example. One or more of the components in the first package level 120 may include through vias 190 extending at least from a back side to the BEOL build-up structure thereof. In the illustrated embodiment, the SOC die and silicon interconnect 122 each include through vias, which can be used for power delivery, for example, to the overlying dies.

The mid-layer interposer 112 in accordance with embodiments can include a silicon bulk layer 111 and an interposer BEOL build-up structure 115 formed similarly as those described for the components in the first and second package levels, including one or more dielectric layers 116 and metal wiring layers 114. It is to be appreciated that while embodiments are described with regard a silicon bulk layer 111, this bulk layer may be formed of other non-silicon materials including glass, silicon carbide, other compound semiconductors, and may be active or passive. A topmost dielectric layer 116 may be an oxide layer and include metal traces and landing pads 117. A planarized surface 119 may extend across the topmost dielectric layer 116 and landing pads 117 to facilitate hybrid bonding. Similarly, a back-side oxide layer 101 with planarized surface may be formed on the underside of the silicon bulk layer 111 for dielectric-dielectric bonding with components in the first package level 120. A plurality of through silicon vias 118 can extend through the silicon bulk layer 111 (and back-side oxide layer 101) to the BEOL build-up structure. The mid-layer interposer 112 may additionally include a plurality of devices 113, including passive devices such as MIM capacitors (planar or 3D) or trench capacitors, magnetic elements (inductors, coupled inductors, etc.), or even active devices such as transistors. In an embodiment, the mid-layer interposer includes an array of trench capacitors. Alternative materials may also be used in place of the silicon bulk layer 111, such as glass or other non-silicon materials. Other embodiments may include landing pads including through vias incorporated within back-side oxide layer 101 that can be planarized, similar to incorporation of top landing pads 117 and planarization, to facilitate hybrid bonding with components in the first package level 120.

The components within the second package level 140 may be embedded/encapsulated within an encapsulation layer 148, such as an inorganic encapsulation/fill layer material (e.g. dielectric/oxide or silicon) or organic molding compound layer material (e.g. molding compound material). A silicon encapsulation layer material, or gap fill material, can be used where no vertical interconnections are to be made therethrough. Likewise, the components within the first package level 120 can be embedded/encapsulated within an encapsulation layer 130, such as an inorganic encapsulation layer material (e.g. oxide, oxynitride, silicon) or organic molding compound layer material. A plurality of through vias 132 (e.g. through dielectric vias) may extend completely through a thickness of the encapsulation layer 130, and laterally adjacent the components, to make electrical connection within the mid-layer interposer 112, such as with the through vias 118 (through silicon vias, through glass vias, etc.). A back-side redistribution layer (RDL) 125 may optionally be formed underneath the encapsulation layer 130. The back-side RDL 125 may include contact pads 197 formed on the through vias 132 and through vias 190. The back-side RDL 125 may include one or more dielectric layers 195 and metal routing layers 196, and landing pads 198 which can receive solder bumps 105. The metal routing layers 196 may be formed using thin film techniques, or alternatively with damascene processing.

Figure 4B:
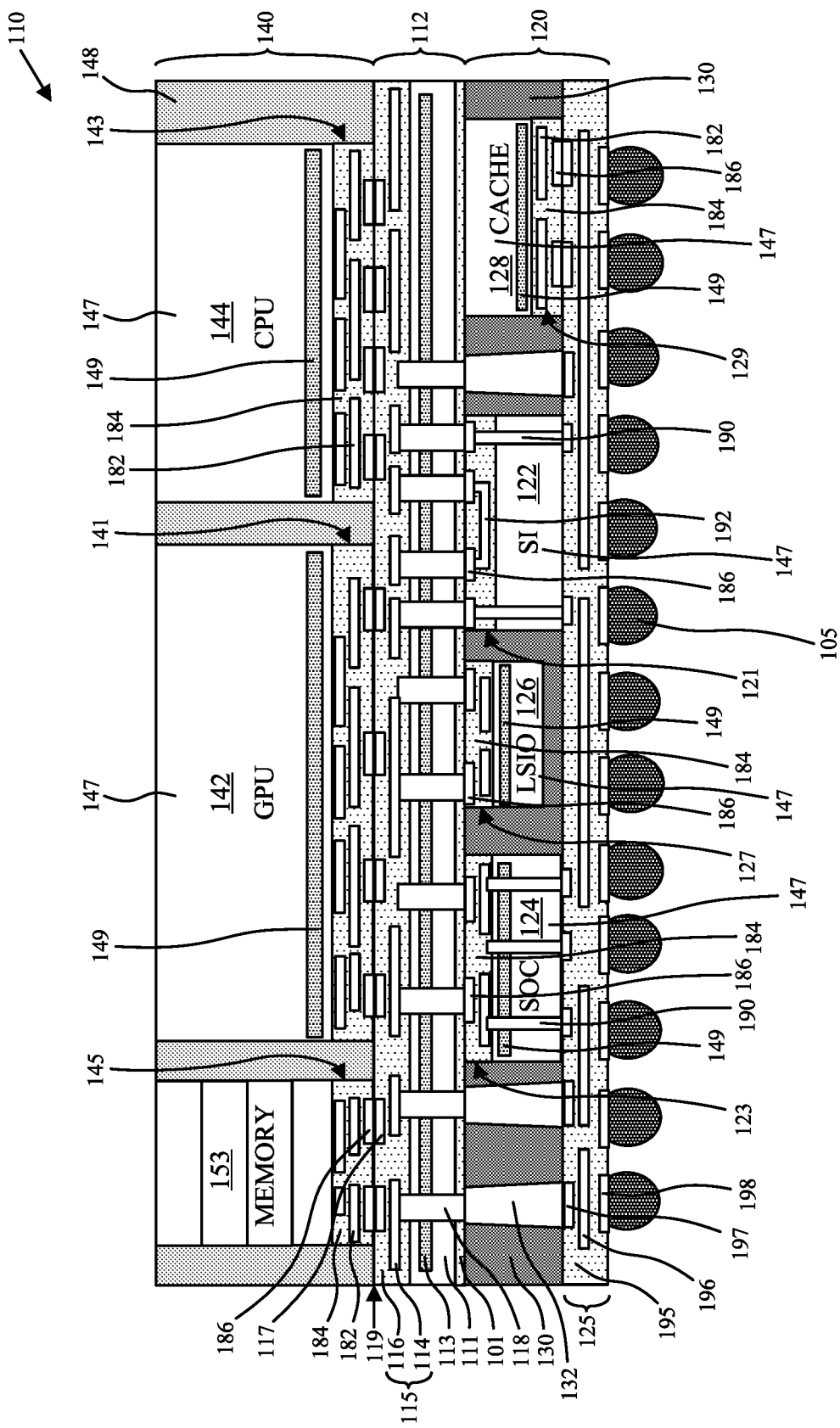

Referring now to FIG. 4B a 3D system 110 is illustrated similar to that of FIG. 4A with two variations. Firstly, any of the first level components may be bonded back-side up to the mid-layer interposer 112 (such as with a back side oxide bonding layer on a back side of a silicon bulk layer 147 of the component). This configuration is illustrated with cache die 128. A second variation is the memory die stack 153, which shows a second level component formed of a die stack rather than a monolithic die. While a memory die stack 153 is illustrated it is understood this is exemplary and components with stacked dies are not limited to memory.

Figure 5A:
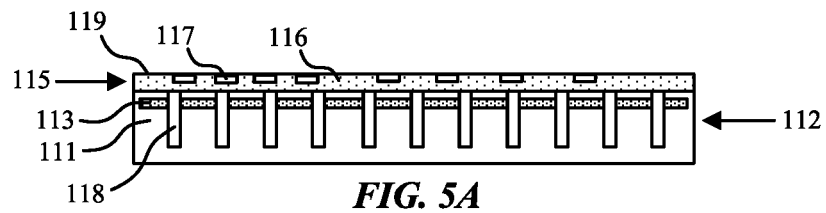
FIGS. 5A-5F are schematic cross-sectional side view illustrations for a die-first reconstitution sequence of forming a 3D system with mid-layer interposer and component with pre-formed through vias in accordance with an embodiment.

FIGS. 5A-5F are schematic cross-sectional side view illustrations for a die-first reconstitution sequence of forming a 3D system with mid-layer interposer and component with pre-formed through vias in accordance with an embodiment. Such a sequence may begin with mid-layer interposer 112 as shown in FIG. 5A. At this stage, the silicon bulk layer 111 may be a silicon wafer. As shown in FIG. 5A, through vias 118 (e.g. through silicon vias, etc.) may already be formed into the silicon bulk layer 111 for future reveal.

Figure 5B:
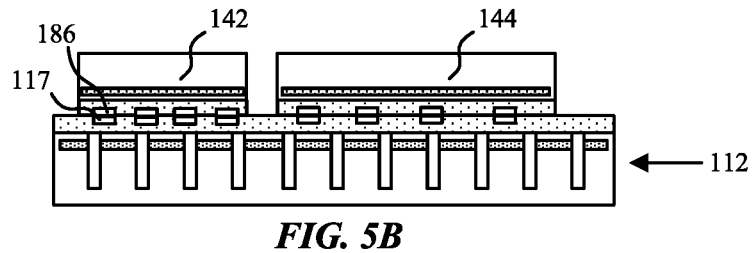
Figure 5C:
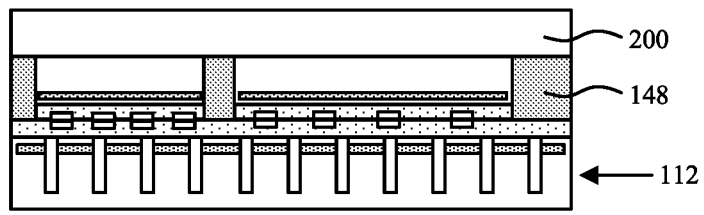
Figure 5D:
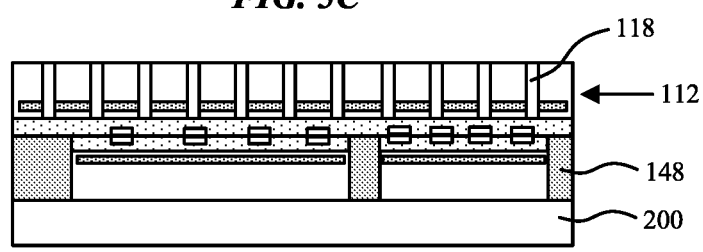
Figure 5E:
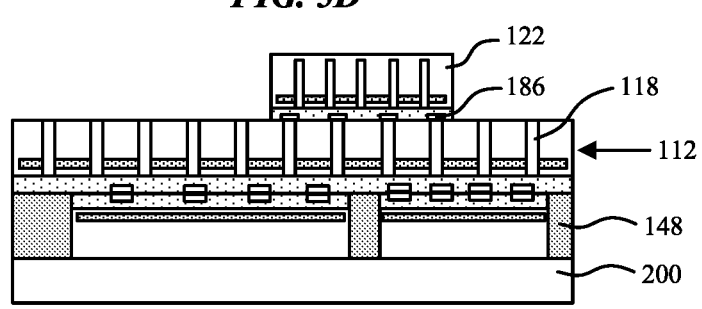
Figure 5F:
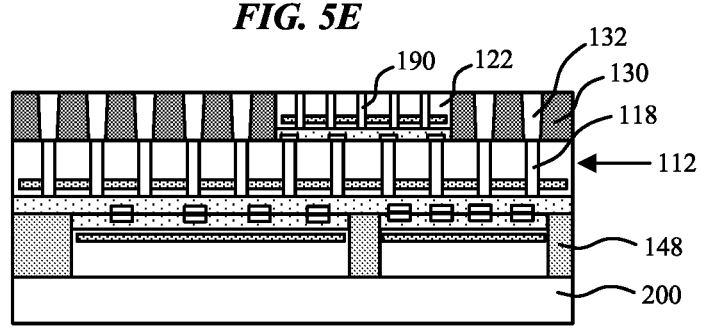

Referring to FIG. 5B one or more components can be hybrid bonded to the planarized surface of the BEOL build-up structure 115 of the mid-layer interposer 112 to form dielectric-dielectric and metal-metal bonds. In the particular embodiment illustrated the components are the high power dies 142, 144, though this is merely exemplary. The components can then be encapsulated with an encapsulation layer 148 (also referred to as gap fill) such as a molding compound material or inorganic material (e.g. oxide, silicon) as shown in FIG. 5C, followed by bonding of optional thermal/structure cap 200, such as another silicon wafer. For thicker dies a molding compound may be used. Encapsulation layer 148 may optionally cover the high power dies 142, 144. This may be followed by grinding operation as shown in FIG. 5D to remove a thickness of the silicon bulk layer 111 and reveal the through vias 118. A second hybrid bonding operation may then be performed to add the first package level components. Referring to FIG. 5E the silicon interconnect 122 is illustrated, though this is merely exemplary. As shown, the silicon interconnect 122 can be placed face down with landing pads 186 aligned with the through vias 118 (or thin intervening routing layer). This can be followed as shown in FIG. 5F by the formation of a second encapsulation layer 130 (or gap fill layer), and another grinding operation to reduce a thickness of the silicon bulk layer 147 of the silicon interconnect 122 and reveal the through vias 190. Through vias 132 may then be formed by etching and plating, for example. Through vias 132 can be through mold vias (TMVs) or through oxide vias (TOVs) depending upon material of the encapsulation layer 130. This may be followed by building of RDL 125 (FIGS. 4A-4B), solder bump 105 drop, and singulation of the reconstituted structure to form a plurality of 3D systems 110.

Figure 6A:
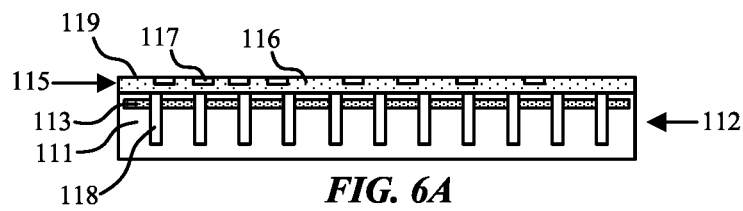
FIGS. 6A-6F are schematic cross-sectional side view illustrations for a component-first reconstitution sequence of forming a 3D system with mid-layer interposer and component with pre-formed through vias in accordance with an embodiment.
Figure 6B:
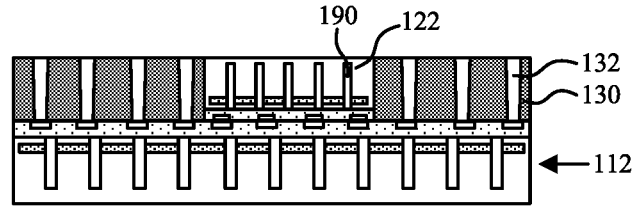
Figure 6C:
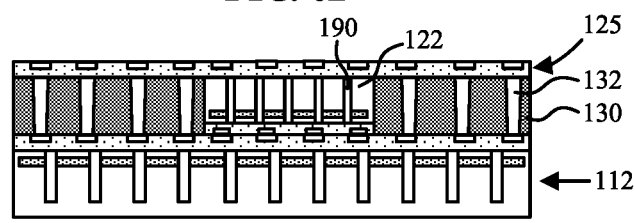
Figure 6D:
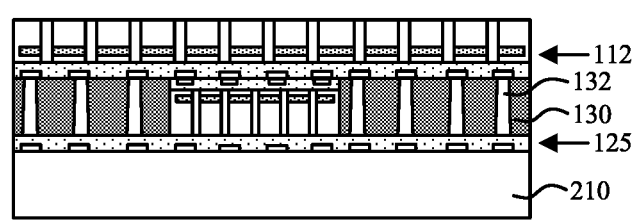
Figure 6E:
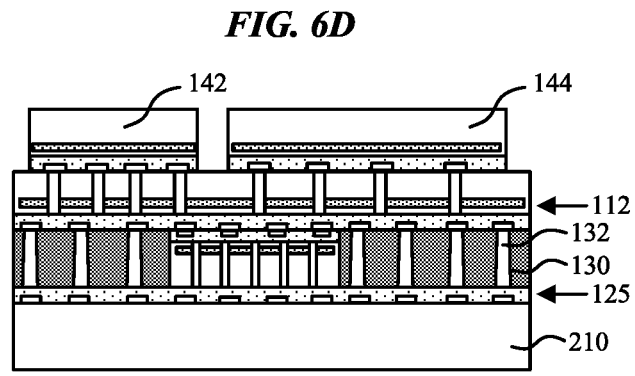
Figure 6F:
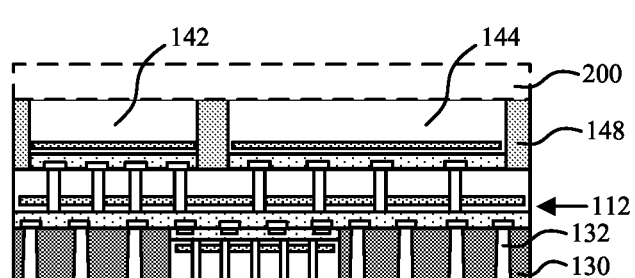

FIGS. 6A-6F are schematic cross-sectional side view illustrations for a component-first reconstitution sequence of forming a 3D system with mid-layer interposer and component with pre-formed through vias in accordance with an embodiment. The process flow of FIGS. 6A-6FG is similar to that of FIGS. 5A-5F with a difference being in hybrid bonding of the components in the first package level are hybrid bonded first. As shown in FIG. 6A the process flow begins with a mid-layer interposer 112. One or more components can be hybrid bonded to the planarized surface of the BEOL build-up structure 115 of the mid-layer interposer 112 as shown in FIG. 6B to form dielectric-dielectric and metal-metal bonds. In the particular embodiment illustrated, a silicon interconnect 122 is bonded, followed by formation of encapsulation layer 130 and through vias 132. This may be followed by an etching operation to reveal through vias 190, and formation of RDL 125 as shown in FIG. 6C. A second carrier substrate 210 may then be optionally bonded to the RDL 125 as shown in FIG. 6D. The mid-layer interposer 112 may be ground and etched to reveal through vias 118 and planarized for hybrid bonding. Referring to FIG. 6E one or more components can then be hybrid bonded to the mid-layer interposer 112. In the exemplary embodiment illustrated high power dies 142, 144 are bonded face down. A second encapsulation layer 148 may then be formed around the high power dies 142, 144 followed by optional attachment of a thermal/structure cap 200. Optionally, second encapsulation layer 148 can cover the high power dies 142, 144 rather than the thermal/structure cap 200. The second carrier substrate 210 may then be removed followed by solder bump 105 drop, and singulation of the reconstituted structure to form a plurality of 3D systems 110.

It is to be appreciated that while both reconstitution sequences FIGS. 5A-5F and FIGS. 6A-6F illustrate via first approaches where pre-formed through vias (e.g. through silicon vias, etc.) are formed in a silicon interconnect 122 that this may be provided for any of the components in the first package level 120.

Figure 7A:
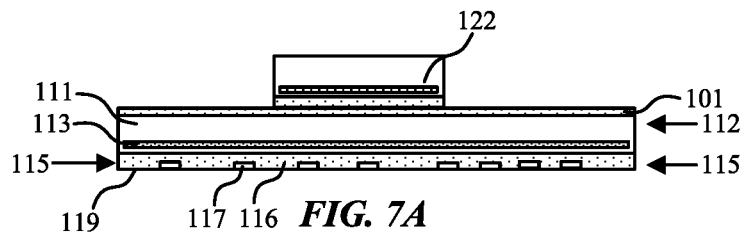
FIGS. 7A-7D are schematic cross-sectional side view illustrations for a component-first reconstitution sequence of forming a 3D system with mid-layer interposer and component through via-last formation in accordance with an embodiment.
Figure 7B:
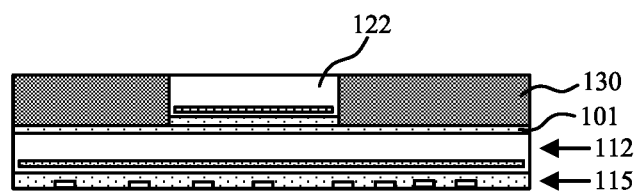
Figure 7C:
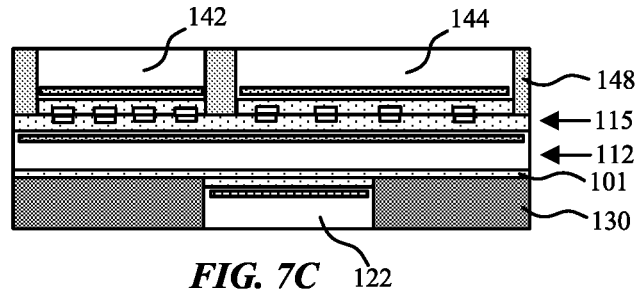
Figure 7D:
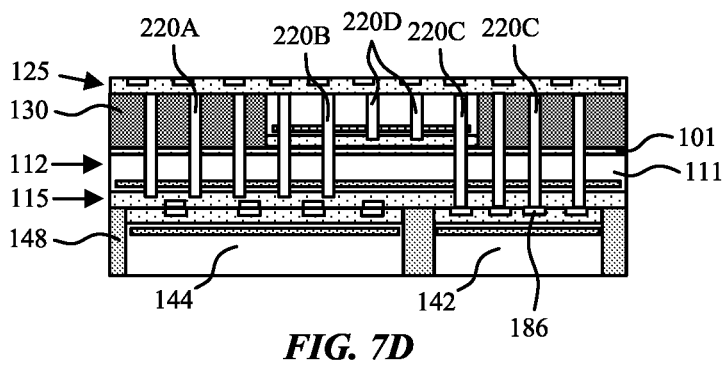

Referring now to FIGS. 7A-7D schematic cross-sectional side view illustrations are provided for a component-first sequence of forming a 3D system with mid-layer interposer 112 and component through via-last formation in accordance with an embodiment. As shown in FIG. 7A the sequence can begin with bonding the front side of a silicon interconnect 122 or other first package level component to the back side of the mid-layer interposer 112, or specifically to the back-side oxide layer 101 formed on the silicon bulk layer 111. In this manner, bonding is made with dielectric-dielectric bonds, and no metal-metal bonds. Notably, the front side of silicon interconnect 122 can optionally not include landing pads 186 previously illustrated in such a via-last process sequence. This can be followed by formation of encapsulation layer around the silicon interconnect 122 and any other components as shown in FIG. 7B. A planarization or etching operation may then be optionally performed to expose landing pads 186. The reconstituted stack-up can then be flipped, followed by hybrid bonding of multiple components onto the BEOL build-up structure 115 of the mid-layer interposer 112. In the exemplary embodiment illustrated in FIG. 7C high power dies 142, 144 are bonded face down. A second encapsulation layer 148 may then be formed around the high power dies 142, 144 followed by optional attachment of a thermal/structure cap 200 as previously described. Referring now to FIG. 7D the reconstituted stack-up is flipped again and through vias 220B are formed completely through the silicon interconnect 122 and into the BEOL build-up structure 115. Through vias 220A are also formed through the encapsulation layer 130 and into the BEOL build-up structure 115. Thus, the through vias 220A are also through silicon vias where they extend through the silicon bulk layer 111. This may be followed by building of RDL 125, solder bump 105 drop, and singulation of the reconstituted structure to form a plurality of 3D systems 110 as previously described.

Still referring to FIG. 7D, through vias 220C can also extend all the way through the mid-layer interposer 112 to contact the landing pads 186 of either or both high power dies 142, 144. In this manner the through vias 220C are bonded to the landing pads 186 with metal-metal bonds. Additionally, through vias 220D can be formed that stop within the silicon interconnect 122. This may be followed by formation of RDL 125.

Figure 8A:
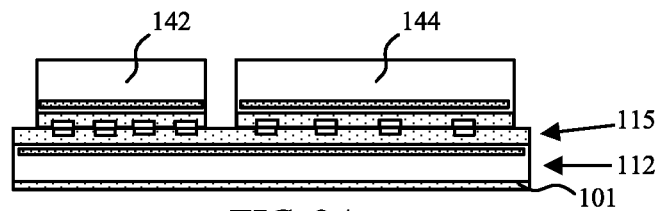
FIGS. 8A-8E are schematic cross-sectional side view illustrations for a die-first reconstitution sequence of forming a 3D system with mid-layer interposer and component through via-last formation in accordance with an embodiment.
Figure 8B:
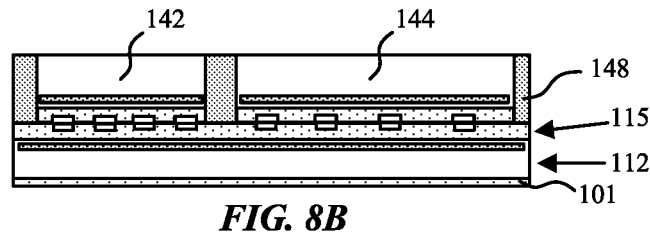
Figure 8C:
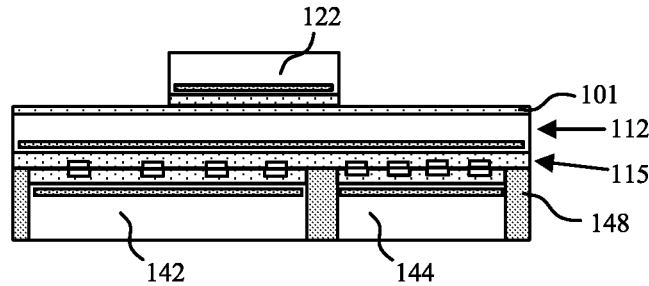
Figure 8D:
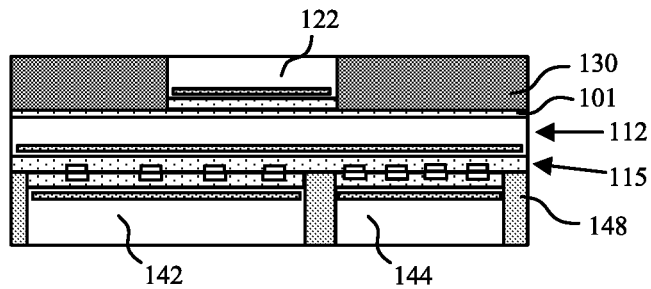
Figure 8E:
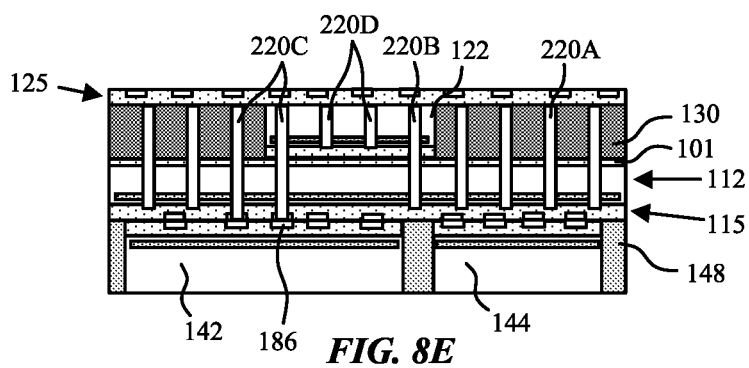

FIGS. 8A-8E are schematic cross-sectional side view illustrations for a die-first sequence of forming a 3D system with mid-layer interposer 112 and component through via-last formation in accordance with an embodiment. The process flow of FIGS. 8A-8E is similar to that of FIGS. 7A-7D with a difference being in hybrid bonding of the components in the second package level are hybrid bonded first. As shown in FIG. 8A the process flow begins with a mid-layer interposer 112. One or more components can be hybrid bonded to the planarized surface of the BEOL build-up structure 115 of the mid-layer interposer 112 as shown in FIG. 8B to form dielectric-dielectric and metal-metal bonds. In the particular embodiment illustrated, high power dies 142, 144 are hybrid bonded, followed by formation of encapsulation layer 148. A thermal/structure cap 200 can then optionally be attached as previously described. The reconstituted structure can then be flipped, followed by bonding the front side of a silicon interconnect 122 or other first package level component to the back side of the mid-layer interposer 112, or specifically to the back-side oxide layer 101 formed on the silicon bulk layer 111 as shown in FIG. 8C. In this manner, bonding is made with dielectric-dielectric bonds, and no metal-metal bonds. This can be followed by formation of encapsulation layer 130 around the silicon interconnect 122 and any other components as shown in FIG. 8D. Referring now to 8E, similar the description of FIG. 7D, through vias 220B are now formed completely through the silicon interconnect 122 and into the BEOL build-up structure 115. Through vias 220A are also formed through the encapsulation layer 130 and into the BEOL build-up structure 115. Thus, the through vias 220A are also through silicon vias where they extend through the silicon bulk layer 111. Additionally, through vias 220D can be formed that stop within the silicon interconnect 122. This may be followed by building of RDL 125, solder bump 105 drop, and singulation of the reconstituted structure to form a plurality of 3D systems 110 as previously described.

The mid-layer interposers 112 in accordance with embodiments can include electrical routing, as well as passive device and/or active devices. In some embodiments the mid-layer interposers 112 can include banks of passive devices such as trench capacitors or MIM capacitors. However, it may not be suitable to connect all capacitors and capacitor banks for all applications, or in the case of defective devices. In accordance with embodiments, the mid-layer interposers can include customized routing and connectivity to the devices.

Figure 9A:
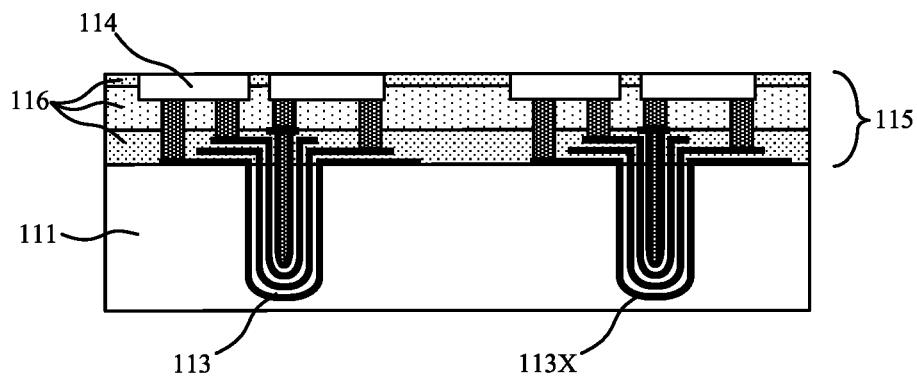
FIGS. 9A-9B are schematic cross-sectional side view illustrations of a sequence for testing and connecting a bank of deep trench capacitors within a mid-layer interposer in accordance with an embodiment.
Figure 9B:
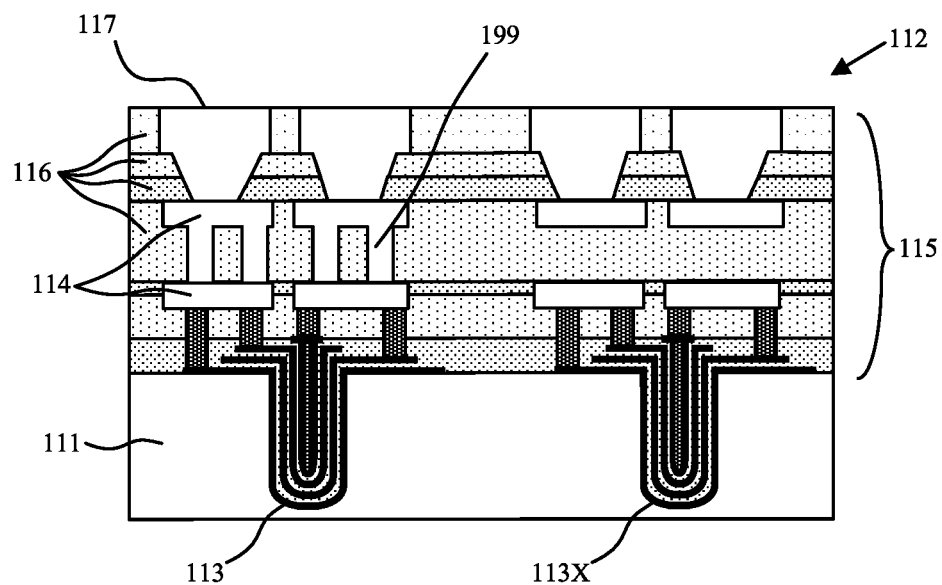

FIGS. 9A-9B are schematic cross-sectional side view illustrations of a sequence for testing and connecting a bank of deep trench capacitors within a mid-layer interposer in accordance with an embodiment. As shown in FIG. 9A the BEOL build-up structure 115 is partially fabricated including devices 113 (deep trench capacitors) as well as dielectric layers 116 and metal wiring layers 114. At this stage the devices can be tested in-line. Good devices 113 can be electrically connected with vias 199, while vias 199 may optionally not be formed to connect defective devices 113X (including passive devices such as MIM capacitors (planar or 3D) or trench capacitors, magnetic elements, or even active devices such as transistors) as shown in FIG. 9B. Thus, the mid-layer interposer may include a dielectric layer 116 within the BEOL build-up structure 115 where vias 199 are connected to only some of the devices 113. As such, the defective devices 113X may be left as floating, or electrically isolated.

Figure 10:
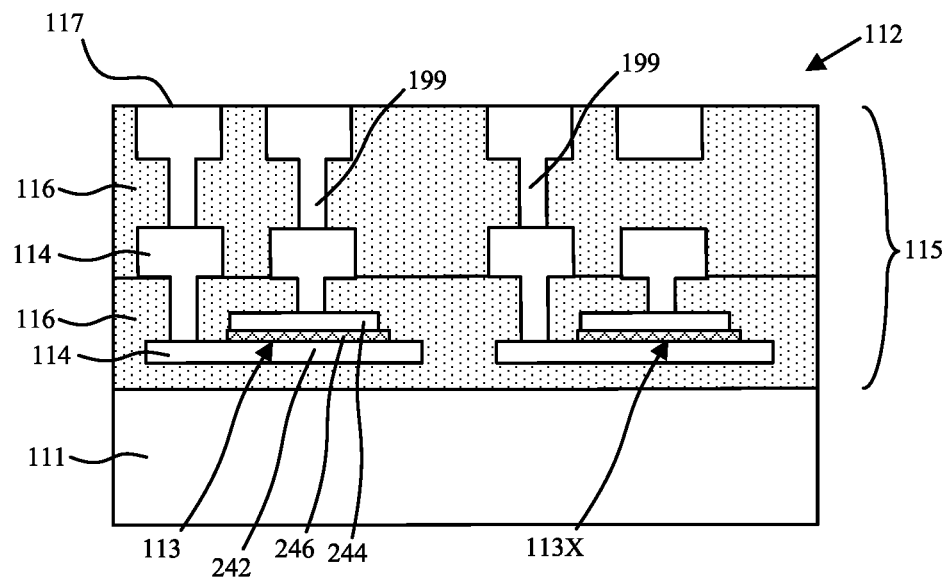
FIG. 10 is a schematic cross-sectional side view illustration of a mid-layer interposer with metal-insulator-metal capacitors in accordance with an embodiment.

As similar embodiment is shown in FIG. 10, where the devices 113 are MIM capacitors include a lower terminal 242 (plate), upper terminal 244 (plate) and high dielectric constant dielectric material 246 therebetween. The lower terminal 242 and upper terminal 244 may be formed of the metal wiring layers 114. The dielectric material 246 may have a higher dielectric constant than the dielectric layers 116 forming the BEOL build-up structure 115.

Still referring to FIG. 10, a via 199 is optionally connected to one of the terminals for a defective device 113X. This may also be the case with the trench capacitors of FIG. 9B. For example, this may be a low power (Vss) connection. However, high power Vdd may not be connected to the defective device 113X with a via 199.

Figure 11A:
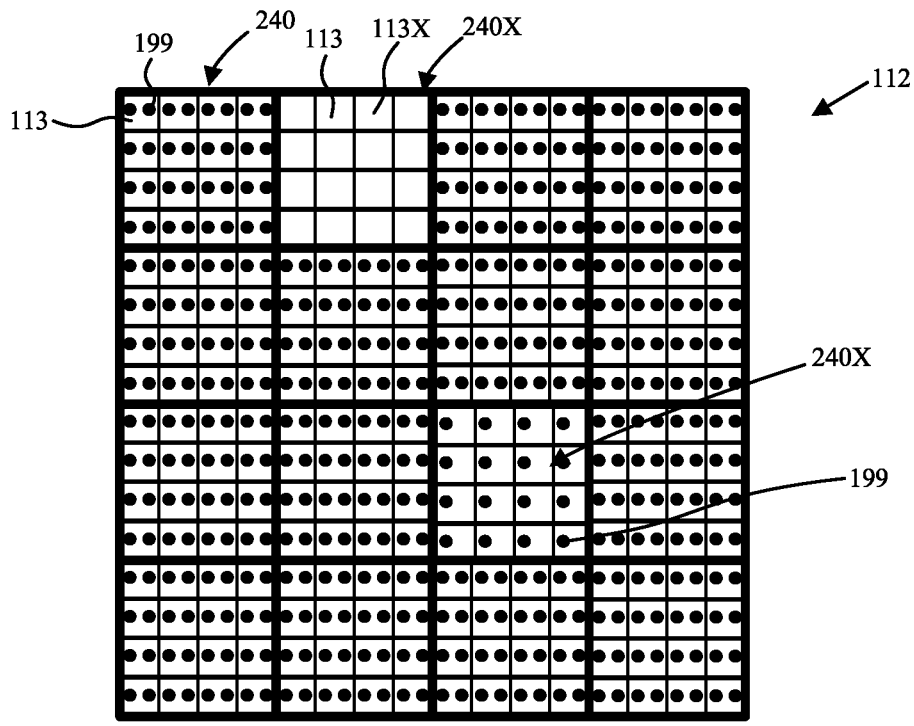
FIG. 11A is a schematic top view illustration of a via connections to capacitors within a mid-layer interposer in accordance with an embodiment.

The programmable writing may be used to connect appropriate vias 199 or provide open wiring. While FIGS. 9A-9B and FIG. 10 are shown at the device scale, the programmable writing may be used to connect, or alternatively mask, entire banks of devices. FIG. 11A is a schematic top view illustration of a via 199 connections to devices 113 within a mid-layer interposer in accordance with an embodiment. As shown individual devices 113 can be arranged into groups of banks 240. Where a defective device 113X is determined, an entire masked bank 240X can be designated. For example, where a single defective device 113X is measured then the via 199 connections can be skipped for an entire associated masked bank 240X. Alternatively, measurements may not be so precise, and instead testing is performed at the bank level, and as such a defective bank may be measured which indicates one or more defective device 113X in the masked bank 240X. In an embodiment, the mid-layer interposer 112 may include a plurality of banks 240, including one or more masked banks 240X including an array of capacitors that are either not electrically connected, or incompletely connected, such as with only Vss via 199 connections.

Figure 11B:
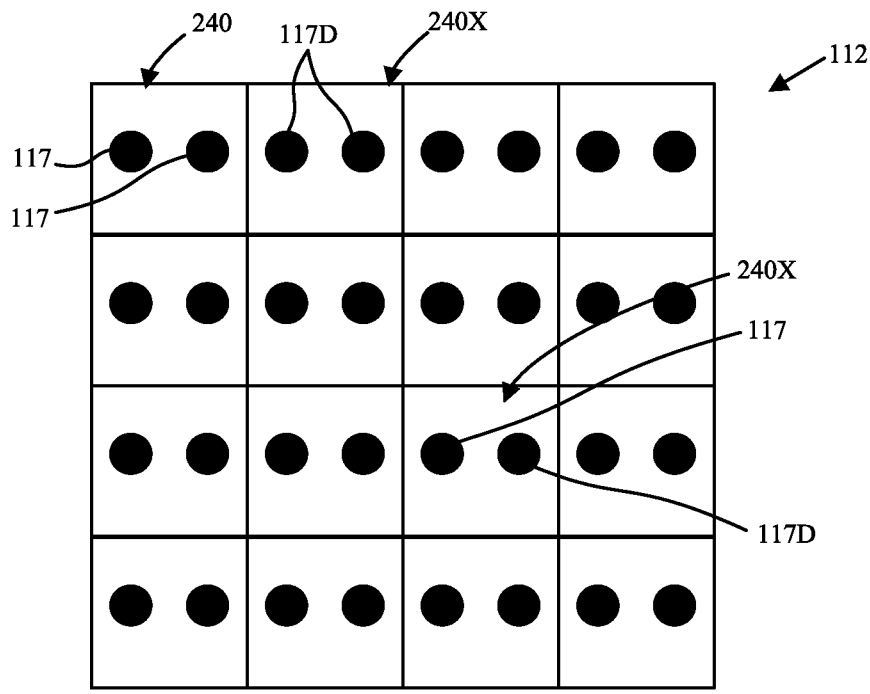
FIG. 11B is a schematic top view illustration of landing pad connections to capacitor banks in accordance with an embodiment.

FIG. 11B is a schematic top view illustration of landing pad connections to capacitor banks in accordance with an embodiment. Thus, FIG. 11B illustrates the mid-layer interposer 112 further along in the fabrication sequence. As shown, landing pads 117 may still be formed for each bank 240 and masked bank 240X. This can facilitate further metal-metal bonding. For example, the two illustrated landing pads 117 can be for low power (Vss) and high power (Vdd) connection. Masked banks may include one or more dummy landing pads 117D that are not connected to the capacitors. For example, the dummy landing pads can be for both Vss and Vdd connections, or just for the Vdd connection in the exemplary embodiments. Embodiments are not limited to two landing pads 117, and this is merely exemplary. In accordance with embodiments the dummy landing pads 117D for a masked bank 240X may overlay an array of capacitors that are not electrically connected or incompletely connected to the corresponding landing pads 117 of the masked bank.

Up until this point embodiments have been described specifically with regard to a mid-layer interposer that can facilitate WoW or CoW bonding techniques, provide additional routing area, etc. More specifically the mid-layer interposer has been described as including a bulk layer 111 such as silicon bulk layer 111 or alternative material. For example, the bulk layer 111 could be a rigid layer such as silicon, glass or other non-silicon materials. In particular, the bulk layer 111 may be compatible with fabrication plant substrate sizes, such as 300 mm wafers, 200 mm wafers, etc. In other embodiments, the mid-layer interposer can be an intermediate dielectric layer deposited during the reconstitution sequence. The intermediate dielectric layer may include a managed surface for hybrid bonding and electrical connections in an embodiment. In an embodiment, stitched vias (TVs) may be formed through the intermediate dielectric layer for electrical connections in a via-last approach.

Figure 12A:
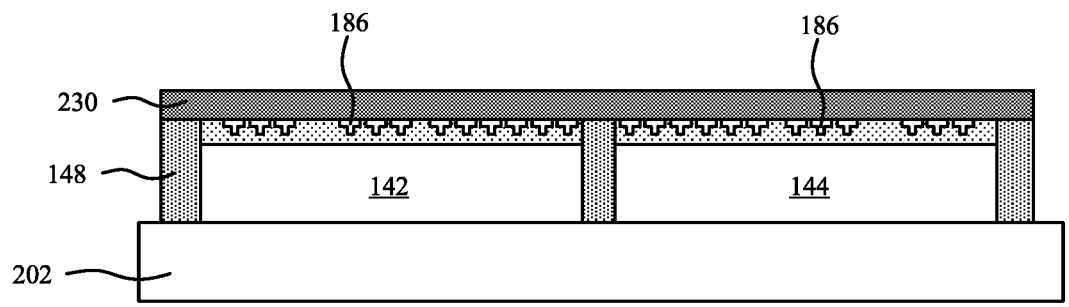
FIGS. 12A-12C are schematic cross-sectional side view illustrations for a reconstitution sequence of forming a 3D system with an intermediate dielectric layer and managed surface for hybrid bonding in accordance with an embodiment.
Figure 12B:
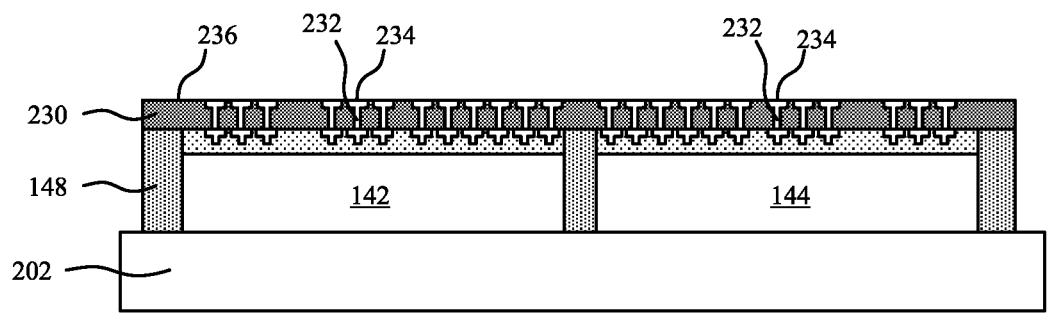
Figure 12C:
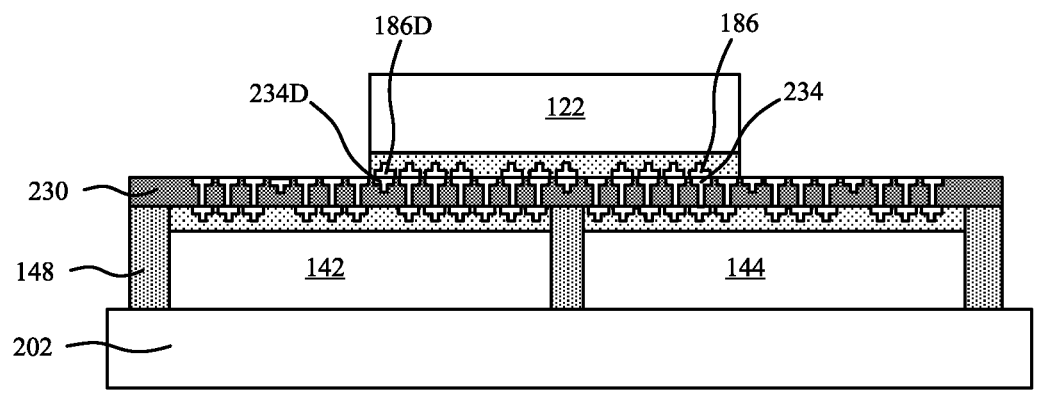

FIGS. 12A-12C are schematic cross-sectional side view illustrations for a reconstitution sequence of forming a 3D system with an intermediate dielectric layer and managed surface for hybrid bonding in accordance with an embodiment. Referring to FIG. 12A a stage of the process sequence is illustrated in which high power dies 142, 144 are placed face up on a carrier substrate 202 and encapsulated in an encapsulation layer 148. It is to be appreciated, that high power dies 142, 144 are exemplary and any die set can be used. An intermediate dielectric layer 230, such as an oxide, oxynitride, polymer or even silicon, is then formed over the encapsulation layer and high power dies 142, 144. Referring to FIG. 12B a plurality of through dielectric vias 232 (e.g. copper) are formed completely through the intermediate dielectric layer 230 to connect directly to landing pads 186 with metal-metal bonds. The intermediate dielectric layer 230 can then be planarized to for a planar managed surface of the dielectric layer 230 material and metal bond pads 234. In this manner, the managed surface 236 can be prepared for hybrid bonding. A silicon interconnect 122, for example, can then be hybrid bonded to the managed surface 236 using CoW hybrid bonding for example with dielectric-dielectric bonds any metal-metal bonds between the landing pads 186 and metal bond pads 234. In the particular embodiment illustrated in FIG. 12C dummy landing pads 186D and dummy metal bond pads 234D may be formed to facilitate metal-metal bond area. It is to be appreciated, that silicon interconnect 122 is exemplary and any die or component can be used.

While not separately illustrated, the reconstituted structure can then be further processed similarly as other embodiments including formation of another encapsulation layer around the silicon interconnect 122, formation of through vias, various RDL layers, thermal/structure cap, solder bumps, etc. and singulated into 3D systems 110.

Figure 13A:
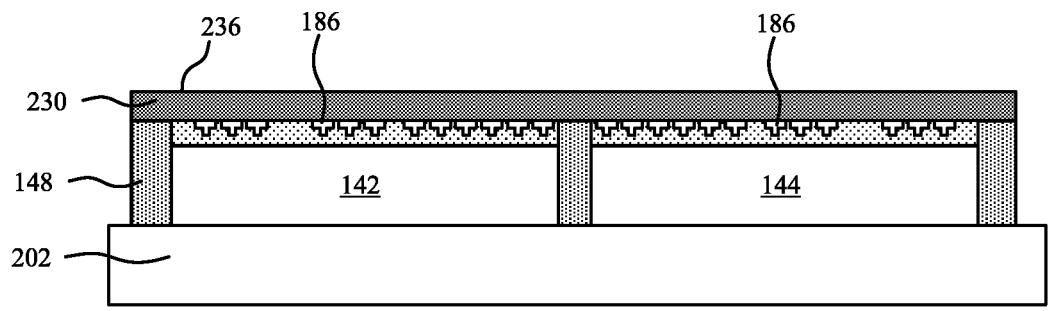
FIGS. 13A-13C are schematic cross-sectional side view illustrations for a reconstitution sequence of forming a 3D system with an intermediate dielectric layer and via stitching in accordance with an embodiment.
Figure 13B:
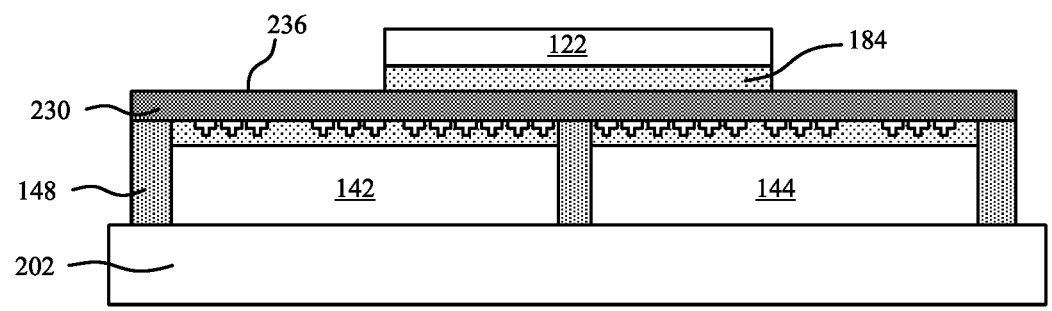
Figure 13C:
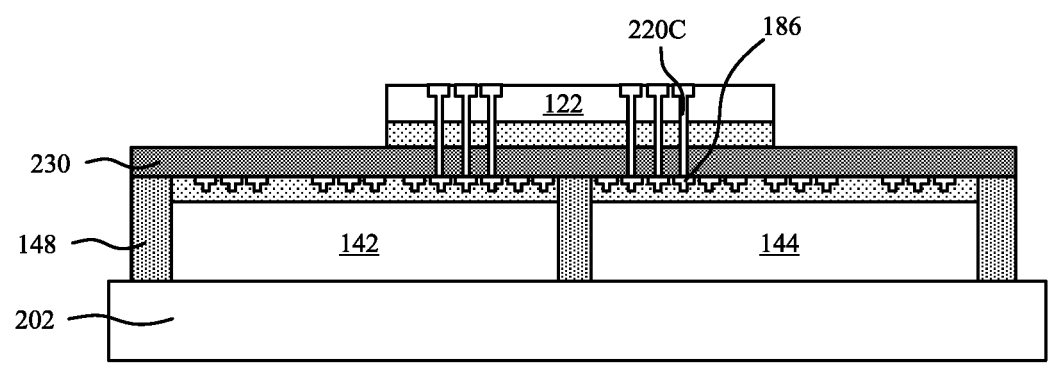

FIGS. 13A-13C are schematic cross-sectional side view illustrations for a reconstitution sequence of forming a 3D system with an intermediate dielectric layer and via stitching in accordance with an embodiment. Referring to FIG. 13A the process sequence begins similarly as FIG. 12A. The surface of the intermediate dielectric layer 230 can then be planarized to form managed surface 236. A die or other component, illustrated as exemplary silicon interconnect 122, can then be bonded to the intermediate dielectric layer 230 as shown in FIG. 12B. For example, this may be achieved with surface activation and dielectric-dielectric bonds between the dielectric layer 184 and intermediate dielectric layer 230. A plurality of through vias 220C can then be formed through the silicon interconnect to the landing pads 186 to form metal-metal bonds. This is similar to the via-last approach described and illustrated in FIG. 7D.

While not separately illustrated, the reconstituted structure can then be further processed similarly as other embodiments including formation of another encapsulation layer around the silicon interconnect 122, formation of through vias, various RDL layers, thermal/structure cap, solder bumps, etc. and singulated into 3D systems 110.

In an embodiment, a 3D system includes a mid-layer interposer, a first package level on a first side of the mid-layer interposer, the first package level including a component (e.g. silicon interconnect 122) bonded to the mid-layer interposer with dielectric-dielectric bonds, and a second package level on a second side of the mid-layer interposer, the second package level including a first die (e.g. high power die 142, 144) bonded to the mid-layer interposer with dielectric-dielectric bonds. A plurality of through vias can extend completely through the component and at least partially through the mid-layer interposer. For example, in the embodiment illustrated in FIG. 7D the through vias 220B formed completely through the silicon interconnect 122 and into the BEOL build-up structure 115. In the embodiments illustrated in FIG. 7D and FIG. 13C through vias 220C extend all the way through the mid-layer interposer 112 to contact the landing pads 186 of either or both high power dies 142, 144. In the embodiment illustrated in FIG. 13C the mid-layer interposer is an intermediate dielectric layer 230.

In utilizing the various aspects of the embodiments, it would become apparent to one skilled in the art that combinations or variations of the above embodiments are possible for forming a 3D system with mid-layer interposer. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A three-dimensional (3D) system comprising:
   a mid-layer interposer;
   a first package level underneath the mid-layer interposer, the first package level including a component bonded to the mid-layer interposer with dielectric-dielectric bonds;
   a second package level over the mid-layer interposer, the second package level including a first die bonded to the mid-layer interposer with metal-metal bonds; and
   a plurality of through vias (TVs), each TV extending completely through the component and at least partially through the mid-layer interposer.

2. The 3D system of claim 1, wherein the first die is a logic die.

3. The 3D system of claim 1, wherein the component is embedded in an encapsulation layer.

4. The 3D system of claim 3, further comprising a second plurality of through vias laterally adjacent the component and extending through the encapsulation layer.

5. The 3D system of claim 4, wherein the first die is hybrid bonded to the mid-layer interposer with dielectric-dielectric bonds and the metal-metal bonds.

6. The 3D system of claim 4, wherein the first die is thicker than the component.

7. The 3D system of claim 4, wherein the component includes a component silicon bulk layer and a component back-end-of-the-line (BEOL) stack-up, and a back side of the silicon bulk layer is bonded to the mid-layer interposer with the dielectric-dielectric bonds.

8. The 3D system of claim 4, further comprising a set of through vias extending through the mid-layer interposer.

9. The 3D system of claim 8, wherein the mid-layer interposer includes an interposer silicon bulk layer and an interposer back-end-of-the-line (BEOL) stack-up.

10. The 3D system of claim 9, wherein the mid-layer interposer includes an array of capacitors, an array of magnet elements, or both.

11. The 3D system of claim 9, wherein the mid-layer interposer includes active devices.

12. The 3D system of claim 1, further comprising a second die bonded to the mid-layer interposer with dielectric-dielectric bonds and metal-metal bonds.

13. The 3D system of claim 12, wherein the component includes a portion of a die-to-die routing path between the first die and the second die.

14. The 3D system of claim 13, wherein the die-to-die routing path passes through a portion of a set of through vias extending through the mid-layer interposer.

15. The 3D system of claim 14, wherein the first die is a central processor unit (CPU) and the second die is a graphics processor unit (GPU).

16. The 3D system of claim 1, wherein the second package level includes a stacked die component bonded to the mid-layer interposer with metal-metal bonds.

17. The 3D system of claim 1, wherein the mid-layer interposer includes a dielectric layer with through dielectric vias that extend completely through the mid-layer interposer and form metal-metal bonds with contact pads of the first die.

18. The 3D system of claim 1, wherein the mid-layer interposer includes a plurality of banks of devices, wherein the plurality of banks of devices includes a masked bank with a dummy landing pad not connected to devices in the masked bank.

19. A 3D system comprising:
   a mid-layer interposer;
   a first package level on a first side of the mid-layer interposer, the first package level including a component bonded to the mid-layer interposer with dielectric-dielectric bonds;
   a second package level on a second side of the mid-layer interposer, the second package level including a first die bonded to the mid-layer interposer with dielectric-dielectric bonds; and
   a plurality of through vias (TVs), each TV extending completely through the component and at least partially through the mid-layer interposer.

20. The 3D system of claim 19, wherein the plurality of through vias extends completely through the mid-layer interposer to landing pads of the first die.

21. The 3D system of claim 20, wherein the mid-layer interposer is an intermediate dielectric layer.

* * * * *